(12) United States Patent
Jaensch et al.

(10) Patent No.: US 11,094,970 B2
(45) Date of Patent: Aug. 17, 2021

(54) COOLING FOR BATTERY-INTEGRATED POWER ELECTRONICS SYSTEM

(71) Applicant: Dr. Ing. h.c. F. Porsche Aktiengesellschaft, Stuttgart (DE)

(72) Inventors: Malte Jaensch, Bietigheim-Bissingen (DE); Stefan Götz, Forstern (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 0 days.

(21) Appl. No.: 16/285,538

(22) Filed: Feb. 26, 2019

(65) Prior Publication Data

US 2019/0273288 A1 Sep. 5, 2019

(30) Foreign Application Priority Data

Mar. 5, 2018 (DE) .......................... 102018104935.8

(51) Int. Cl.
*H01M 10/42* (2006.01)
*H01M 10/613* (2014.01)
(Continued)

(52) U.S. Cl.
CPC ..... *H01M 10/4257* (2013.01); *H01M 10/613* (2015.04); *H01M 10/625* (2015.04);
(Continued)

(58) Field of Classification Search
CPC ............. H01M 10/613; H01M 10/625; H01M 10/647; H01M 10/653; H01M 10/667;
(Continued)

(56) References Cited

U.S. PATENT DOCUMENTS 5,756,222 A * 5/1998 Bercaw ..................... C23C 8/02
428/649
8,222,729 B2 7/2012 Miyachi
(Continued)

FOREIGN PATENT DOCUMENTS

CN 106130408 A 11/2016
DE 102009030017 A1 12/2010
(Continued)

OTHER PUBLICATIONS

Korean Notice of Preliminary Rejection for Korean Application No. 10-2018-0113537, dated May 14, 2020, 3 pages.
(Continued)

*Primary Examiner* — Minh N Trinh
(74) *Attorney, Agent, or Firm* — RatnerPrestia

(57) ABSTRACT

Method for providing cooling of a power electronics system which is integrated in a battery module, in which method the battery module has a battery housing, containing a large number of energy storage units and the power electronics system which is integrated adjacent thereto and includes a printed circuit board which is populated with power semiconductor switches, and a thermally conductive element which creates thermal contact between the respective energy storage units and the power electronics system. Cooling of the power electronics system is achieved by the thermally conductive element which renders possible transfer of thermal energy from the power electronics system to the energy storage units. At least one side of the battery housing is coupled to a cooling system. A surface area of the thermally conductive element is connected to a respective energy storage unit and is contacted by way of a respective curved portion.

13 Claims, 11 Drawing Sheets

(51) Int. Cl.
*H01M 10/625* (2014.01)
*H01M 10/653* (2014.01)
*H01M 10/667* (2014.01)
*H01M 10/647* (2014.01)
*H05K 7/20* (2006.01)
*H01M 50/20* (2021.01)
*B60L 50/64* (2019.01)
*B60L 58/26* (2019.01)

(52) U.S. Cl.
CPC ....... *H01M 10/647* (2015.04); *H01M 10/653* (2015.04); *H01M 10/667* (2015.04); *H01M 50/20* (2021.01); *H05K 7/209* (2013.01); *B60L 50/64* (2019.02); *B60L 58/26* (2019.02); *B60Y 2200/91* (2013.01); *B60Y 2306/05* (2013.01); *B60Y 2400/112* (2013.01); *H01M 2010/4271* (2013.01); *H01M 2220/20* (2013.01)

(58) Field of Classification Search
CPC ....... H01M 2/1077; H01M 2010/4271; H01M 2220/20; H05K 7/209; B60L 50/64; B60L 58/26; B60Y 2200/91; B60Y 2306/05; B60Y 2400/112; Y02E 60/122
See application file for complete search history.

(56) References Cited

U.S. PATENT DOCUMENTS

| | | | | |
|---|---|---|---|---|
| 8,440,339 | B2* | 5/2013 | Harada | H01M 10/613 429/83 |
| 8,871,371 | B2* | 10/2014 | Song | H01M 10/6554 429/120 |
| 9,052,148 | B2 | 6/2015 | Eckstein et al. | |
| 2005/0089750 | A1* | 4/2005 | Ng | H01M 10/6567 429/120 |
| 2008/0090137 | A1 | 4/2008 | Buck et al. | |
| 2009/0214941 | A1* | 8/2009 | Buck | H01M 10/6571 429/120 |
| 2012/0104843 | A1 | 5/2012 | Füchtner | |
| 2012/0152186 | A1 | 6/2012 | Sujan et al. | |
| 2015/0118537 | A1* | 4/2015 | Obasih | H01M 2/0267 429/120 |
| 2016/0093932 | A1* | 3/2016 | Obasih | H01M 10/0525 429/120 |
| 2016/0226421 | A1 | 8/2016 | Kadry et al. | |
| 2016/0318370 | A1 | 11/2016 | Rawlinson | |
| 2017/0294694 | A1* | 10/2017 | Tso | H01M 10/63 |
| 2018/0269548 | A1* | 9/2018 | Chi | H01M 10/653 |
| 2019/0198950 | A1 | 6/2019 | Kuboki et al. | |

FOREIGN PATENT DOCUMENTS

| | | |
|---|---|---|
| DE | 102011050402 A1 | 11/2011 |
| DE | 102011012723 A1 | 8/2012 |
| DE | 102012018113 A1 | 3/2014 |
| DE | 102013020961 A1 | 6/2015 |
| DE | 102014103095 A1 | 9/2015 |
| DE | 102014009772 A1 | 1/2016 |
| JP | 2014175078 A | 9/2014 |
| JP | 2015050057 A | 3/2015 |
| JP | 2015167069 A | 9/2015 |
| JP | 2016212980 A | 12/2016 |
| JP | 2018022603 A | 2/2018 |

OTHER PUBLICATIONS

Goetz et al., "Modular Multilevel Converter with Series and Parallel Module Connectivity: Topology and Control", IEEE Transactions on Power Elecronics, vol. 30, No. 1, Jan. 2015, pp. 203-215.
Japanese Notice of Reasons for Refusal for Japanese Application No. 2018-180022, dated Dec. 11, 2019, 5 pages.
Notice of Reasons for Refusal for Japanese Application No. 2019-030279, dated Apr. 15, 2020, 7 pages.

* cited by examiner

COOLING FOR BATTERY-INTEGRATED POWER ELECTRONICS SYSTEM

CROSS-REFERENCE TO RELATED APPLICATION

This application claims priority to German Patent Application No. DE 10 2018 104 935.8, filed Mar. 5, 2018, which is incorporated by reference herein in its entirety.

FIELD OF THE INVENTION

The present invention relates to a method and to a system for cooling for a battery module with an integrated power electronics system, in which method and system the thermal coupling of the power electronics system to a heat discharge system from the battery module is taken into consideration.

BACKGROUND OF THE INVENTION

If a power electronics system is integrated in a battery module, for example of an electric vehicle, in addition to a large number of energy cells, two heat sources are present. Firstly, the energy cells heat up on account of their non-negligible internal resistance both when charging and also when discharging. Here, a battery cooling system determines a power available to the electric vehicle to a great extent. Often, a liquid cooling arrangement is used for this purpose, said liquid cooling arrangement, even using an air-conditioning compressor, cooling the energy cells to approximately room temperature. Secondly, the power electronics system, for its part, carries high currents, for example a battery current, through electronics components which additionally generate forward power losses and/or switching losses. However, an additional heat source, as produced here by the power electronics system, has not been provided in conventional battery concepts to date. Although conventional vehicle batteries often likewise contain a battery electronics system, in particular for monitoring the battery and/or for battery management, these are not power electronics systems and produce a negligible level of thermal losses.

By way of example, document DE 10 2012 018 113 A1, which is incorporated by reference herein, describes a battery comprising a large number of prismatic energy cells which are installed together with the battery electronics system and a cooling apparatus. However, here, the battery electronics system serves only to interconnect the individual energy cells in the low-voltage range, for example for voltage monitoring or charge equalization between the individual energy cells, and does not disclose a power electronics system for interconnecting currents at a scale of the battery current as a further heat source.

In principle, a typical operating temperature range of the power electronics system and the battery differ. Modern batteries such as Li- or Zn-based batteries (in contrast to high-temperature batteries such as sodium-based batteries) favor ideal operating temperatures which usually reach just above 0° C. to approximately 40° C. (absolute limits are considerably broader). Although a reaction rate increases with the temperature (such as in the case of exothermic reactions) and therefore a current-carrying capacity of the battery increases with the temperature, a risk of overheating and a risk of fire also increase. Therefore, the power of the battery is reduced both at high and low temperatures and said battery favors approximately room temperature. In contrast to this, electronics components can be operated at far below 0° C., for example in the case of semiconductors at least at −20° C., before a faulty, thermally sharply defined, Fermi-Dirac density of states at low temperatures adversely affects operation. Toward the top of a temperature scale, semiconductors allow temperatures up to a so-called junction temperature, which extends to far above 120° C., as a result of which housing temperatures of above 100° C. are possible. The same applies, at least frequently, for a power loss. Batteries dominate the power loss, but generate said power loss over a large surface and usually have a considerable thermal capacity, as is already apparent at a high mass and a high volume. A power electronics system often generates considerably less (here approximately by a factor of 5 to 10) absolute thermal power. However, this usually manifests itself in a highly concentrated manner on a power electronics component. In addition, the power electronics system usually has an extremely low thermal capacity in comparison to the battery. If the heat were not discharged from the electronics system, said electronics system would accordingly heat up to beyond its destruction limit.

American document US 2008/0090137 A1, which is incorporated by reference herein, discloses a battery which integrates a large number of prismatic energy cells, respectively arranged with thermally conductive plates, in a battery housing. A respective mechanical connection between a respective prismatic energy cell and a respective thermally conductive plate can also be released again.

Document DE 10 2009 030 017 A1, which is incorporated by reference herein, concerns a battery, the energy storage units of which consist of electrochemical storage cells and/or of capacitors. A radiator block which discharges heat via cooling or refrigeration means is coupled to the energy storage units.

SUMMARY OF THE INVENTION

Against this background, described herein is a method which solves the problem of cooling for a battery with an integrated power electronics system and, as a result of this, for two heat sources. In particular, the thermal coupling of the power electronics system to a heat discharge system from the battery should be taken into consideration. Also described is a corresponding system for carrying out a method of this kind.

More particularly, described herein is a method for providing cooling of a power electronics system which is integrated in a battery module, in which method the battery module has a battery housing, containing a large number of energy storage units and the power electronics system which is integrated adjacent thereto and comprises a printed circuit board which is populated with power semiconductor switches, and a thermally conductive element which creates thermal contact between the respective energy storage units and the power electronics system, in which method the cooling of the power electronics system is achieved by the thermally conductive element which renders possible transfer of thermal energy from the power electronics system to the energy storage units, and in which method at least one side of the battery housing is coupled to a cooling system, wherein the thermally conductive element is areally connected to a respective energy storage unit and is contacted by way of a respective curved portion, which is integrally formed on the thermally conductive element, by a part of the power electronics system that is adjacent to the respective energy storage element, wherein a spring action between the power electronics system and the thermally conductive element is formed by the curved portion and the thermal contact is increased as a result.

The method according to aspects of the invention makes use of the fact that effective concepts for discharging heat from the energy storage units are already provided by the prior art. For example, the energy storage units can be in thermal contact with an areal base of the battery housing which is likewise areally coupled to a cooling system, by means of which heat can be discharged from the battery module to a sufficient extent. In addition, the method according to aspects of the invention utilizes thermal properties of the two heat sources. For example, the additional thermal energy of the power electronics system, which turns out to be rather low in comparison to the thermal energy generated in the energy storage units, can be easily compensated for by the cooling system of the energy storage unit and does not require any or only a small degree of boosting of the cooling system. Furthermore, thermal operating ranges of the power electronics system and of energy storage elements of different scope allow a relatively large temperature gradient to be formed, as a result of which a correspondingly high flow of heat from the power electronics system to the energy storage units is possible.

A distance between the power electronics system and the energy storage units which is as small as possible is also advantageous, and therefore the thermal energy is conducted as far as possible directly from the thermally conductive element into the energy storage units. It is also further advantageous for the method according to aspects of the invention to already distribute a high energy density of the heat, which is generated primarily at the power semiconductor switches, in the thermally conductive element and pass it on to the energy storage units over a large area.

In one embodiment of the method according to aspects of the invention, the thermally conductive element is presented composed of a single piece of sheet metal in a comb-like manner. A thermally conductive element of this kind then receives the respective energy storage elements between the respective comb teeth or limbs. A technical implementation of this embodiment of the method according to aspects of the invention results in low costs, little installation space and low weight.

The tolerances to be expected in a sheet-metal bending process can be sufficiently large that a contact area is formed between the respective energy storage element and a part of the metal sheet which bears against said energy storage element, which contact area is in thermal contact only at some points. In the same way, the contact area between the power electronics system and the curved portion which is integrally formed on the metal sheet can be restricted to a few, projecting regions of the power electronics system which are advantageously formed on the power semiconductor switches. All of the other regions which are covered by the metal sheet on energy storage elements and power electronics system are usually separated by a small, but thermally insulating, air film.

These tolerances can be compensated for by so-called gap pads which are slightly elastic thermally conductive foils. However, the gap pads increase a thermal transfer resistance between the power electronics system and the metal sheet. As an alternative, very thin lacquer coatings on the metal sheet could be used here in order to provide a necessary electrical insulation together with considerably better thermal conduction.

A very thin coating of the thermally conductive element, which is thermally conducting but at the same time has an electrically insulating effect at least with respect to local voltage differences, is conceivable. Materials having these properties include, for example, polymers. Polymers which may be mentioned are, for example, polyether ether ketone, polyurethane, polyamide, polyimide, Teflon or epoxy which all have an insulating effect up to regions of 10 kV/mm to 100 kV/mm. Coating of the thermally conductive element is preferably executed together with filling with a highly thermally conductive material which is has a thermal conductivity above 10 W/(m K). Materials which may be mentioned are, for example, $Al_2O_3$, ZnO, ZrO or $TiO_2$. Overall, a combination of said electrically insulating materials and said thermally conductive materials will result in a thermal conductivity of greater than 2 W/(m K), this being advantageous in comparison to typical plastics with a thermal conductivity of less than 0.3 W/(m K). Furthermore, coatings with inorganic materials such as, for example, ceramic materials are also conceivable. These coatings may be impregnated with plastic. In order to avoid damage to a coated surface of the thermally conductive element, the coating should be performed only after mechanical treatment of the thermally conductive element, for example by bending or stamping.

The method according to aspects of the invention creates possible ways of compensating for the tolerances mentioned. Since the curved portion of the metal sheet advantageously renders possible a spring action, firstly well-defined contact-pressing of the metal sheet onto the power electronics system is implemented and in addition unevennesses in height of the power electronics system are compensated for. Secondly, the spring action continues on a non-curved part of the metal sheet and there also increases the contact-pressing of that part of the metal sheet which covers the respective energy storage unit. As a result, a tolerance to different thicknesses of the energy storage units is also achieved. This is relevant, in particular, in the case of energy storage units of which the thickness varies with the state of charge and environmental conditions.

In one embodiment of the method according to aspects of the invention, the thermally conductive element is composed of a plurality of bent sheet-metal partial pieces. This may involve at least two bent sheet-metal partial pieces, up to an embodiment of the method according to aspects of the invention in which a respective bent sheet-metal partial piece is associated with each energy storage unit.

In a further embodiment of the method according to aspects of the invention, a respective bent sheet-metal partial piece is presented in a "U"-shaped manner and a respective energy storage unit is received between two limbs of the "U" and the curved portion is embodied by a bend of the "U".

In a yet further embodiment of the method according to aspects of the invention, a respective bent sheet-metal partial piece is presented in a "J"-shaped manner and a respective energy storage unit is contacted by a limb of the "J" and the curved portion is embodied by a bend of the "J".

In one embodiment of the method according to aspects of the invention, the respective energy storage unit selected is either a battery cell which is in the form of a prismatic cell, or a battery cell which is in the form of a pouch cell, or a battery cell which is in the form of a plurality of round cells arranged in series. It is also conceivable for the respective bent sheet-metal partial piece to be designed in the form of a sleeve in order to maximize the thermal contact with a battery cell which is in the form of a round cell.

In one embodiment of the method according to aspects of the invention, the spring action of the curved portion is boosted by a housing cover which presses onto the power electronics system. For example, the housing cover can be connected to the battery housing by a clamping mechanism.

In a yet further embodiment of the method according to aspects of the invention, the spring action of the curved portion is boosted by fixing the power electronics system inside the battery housing. In this case, the fixing can be performed relative to the battery housing and/or to the energy storage units. For example, in the case of energy storage units with screw connections, this screw connection can be used, for example, in order to firstly establish an electrical connection between the power electronics system and energy storage units but secondly also to press the power electronics system against the energy storage units and the interposed thermal element. In particular, screw bolts or else holes with an internal thread are employed in the case of battery cells which are in the form of prismatic cells.

Also described is a system for providing cooling of a power electronics system which is integrated in a battery module, which system has a battery housing, containing a large number of energy storage units and the power electronics system which is integrated adjacent thereto and comprises a printed circuit board which is populated with power semiconductor switches, and a thermally conductive element which creates thermal contact between the respective energy storage units and the power electronics system, in which system the thermally conductive element is designed to implement cooling of the power electronics system by transferring heat from the power electronics system to the energy storage units, and in which system at least one side of the battery housing is coupled to a cooling system, wherein the thermally conductive element is areally connected to a respective energy storage unit and is contacted by way of a respective curved portion, which is integrally formed on the thermally conductive element, by a part of the power electronics system that is adjacent to the respective energy storage element.

In a refinement of the system according to aspects of the invention, the thermally conductive element is formed from a single piece of sheet metal.

In a further refinement of the system according to aspects of the invention, the thermally conductive element is formed from individual "U"-shaped and/or "J"-shaped bent sheet-metal partial pieces.

Also described is a battery module which is equipped with the system according to aspects of the invention and which is designed to execute the method according to aspects of the invention.

BRIEF DESCRIPTION OF THE DRAWING

Further advantages and refinements of the invention can be found in the description and the accompanying drawing.

It is understood that the features mentioned above and the features still to be explained below can be used not only in the respectively indicated combination but also in other combinations or on their own, without departing from the scope of the present invention.

Generally identical components are assigned the same reference numerals.

FIG. 1 shows a schematic illustration of a comb-like thermally conductive element without a curved portion.

FIG. 2 shows schematic illustrations of side views of bent sheet-metal partial pieces which are formed in embodiments of the method according to aspects of the invention.

FIG. 3 shows a perspective illustration of a thermally conductive element which is formed in one embodiment of the method according to aspects of the invention.

FIG. 4 shows a schematic illustration of a side view of a section through a battery module which is obtained with one embodiment of the method according to aspects of the invention.

FIG. 5 shows a perspective illustration of the section through the battery module which is shown in FIG. 4 and obtained with one embodiment of the method according to aspects of the invention.

FIG. 6 shows a perspective illustration of a battery module which is obtained with one embodiment of the method according to aspects of the invention, without a housing cover.

FIG. 7 shows an exploded illustration of a battery module which is obtained with one embodiment of the method according to aspects of the invention, with a horizontally arranged power electronics system.

FIG. 8 shows an exploded illustration of a battery module which is obtained with one embodiment of the method according to aspects of the invention, with a laterally arranged power electronics system.

FIG. 9 shows a perspective illustration of a connection of the power electronics system for one embodiment of the method according to aspects of the invention.

FIG. 10 shows schematic illustrations of constructions during production of a thermally conductive element which is formed for executing the method according to aspects of the invention.

FIG. 11 shows an exploded illustration of a battery module which is obtained with one embodiment of the method according to aspects of the invention.

DETAILED DESCRIPTION OF THE INVENTION

Figure 1:
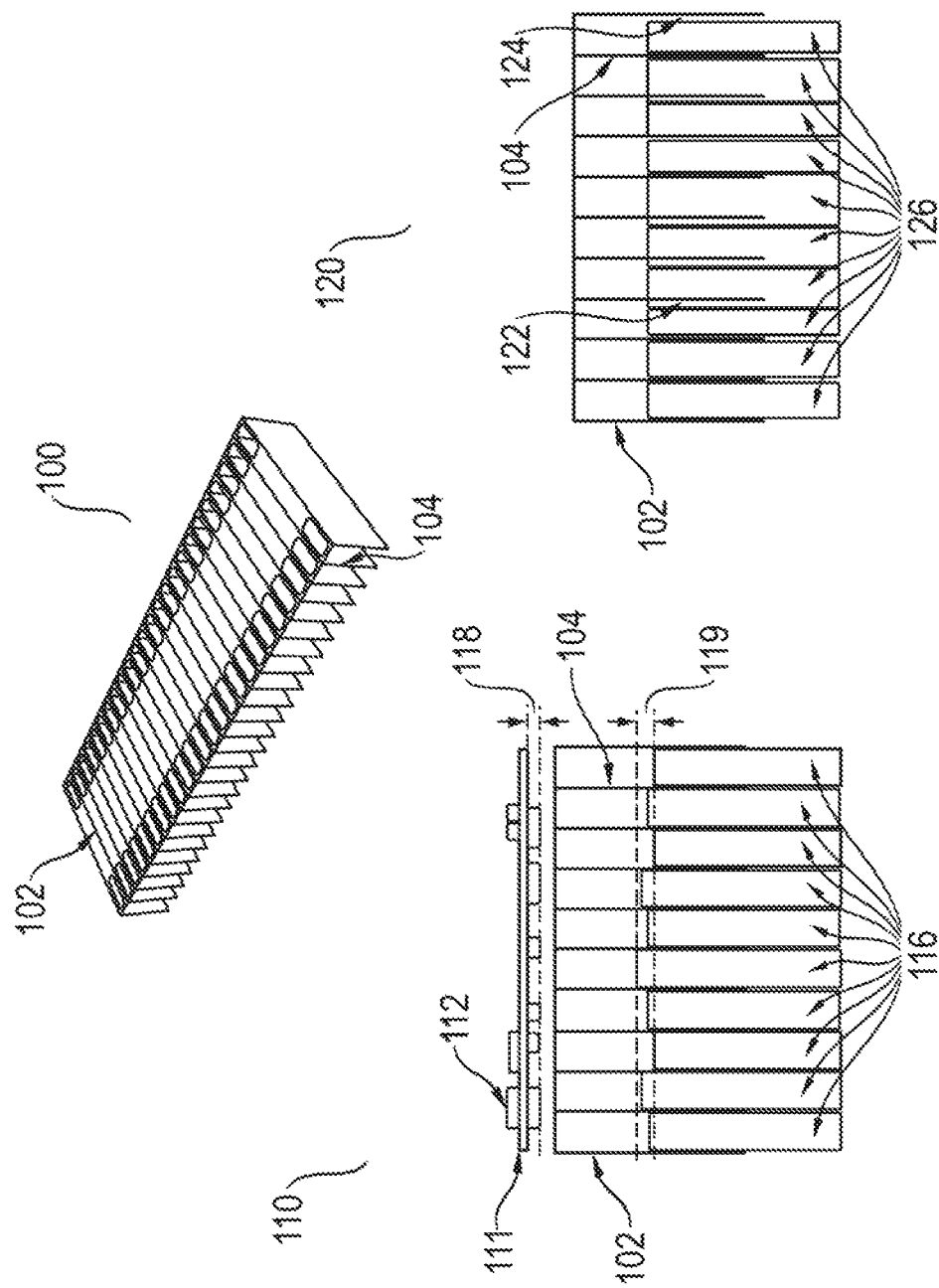

FIG. 1 shows a schematic illustration of a comb-like thermally conductive element 102 without a curved portion. The perspective view 100 presents the thermally conductive element 102, which is manufactured from one piece of sheet metal, with a large number of comb teeth 104. The ovally rounded cutouts which can be seen on the top side receive, after the thermally conductive element 102 has been fitted onto a large number of energy storage units, upper connections of the energy storage units and in this way allow access to the interconnection arrangement of said energy storage units. The view 110 shows an illustration, from the side, of a thermally conductive element 102 which is mounted on energy storage units 116. A printed circuit board 111 of a power electronics system, which printed circuit board is populated with power semiconductor switches 112 amongst other things, is arranged on the top of the thermally conductive element 102. A thermal contact area of the thermally conductive element 102 is limited both due to size differences 119 of the energy storage units 116 and also due to a structural height 118 of the printed circuit board 111, which structural height is the result of said printed circuit board being populated with electronic components of different thicknesses. Under certain circumstances, a thermally insulating air film is located between a power semiconductor switch as heat source and the thermally conductive element which is intended to pass on heat to the energy storage units 116. Equally, it may be the case that some energy storage units 116 are not in contact with the thermally conductive element 102 by way of their upper edge and the heat can be transmitted to the respective energy storage units 116 at such a point only by means of the lateral comb teeth 104. The view 120 demonstrates a further problem in the case of a rigid design of the thermally conductive element 102. The individual energy storage units 126 can have different thicknesses depending on the state of charge and environmental conditions. Therefore, under certain circumstances, it may not be possible to plug-mount the comb-like thermally conductive element onto the energy storage units 126 if a gap 122 between two energy storage units does not correspond to a position of a comb tooth. Alternatively, an air gap 124, which has a thermally insulating effect, may remain after the plug-mounting operation. These possible problems are solved by embodiments of the method according to aspects of the invention.

Figure 2:
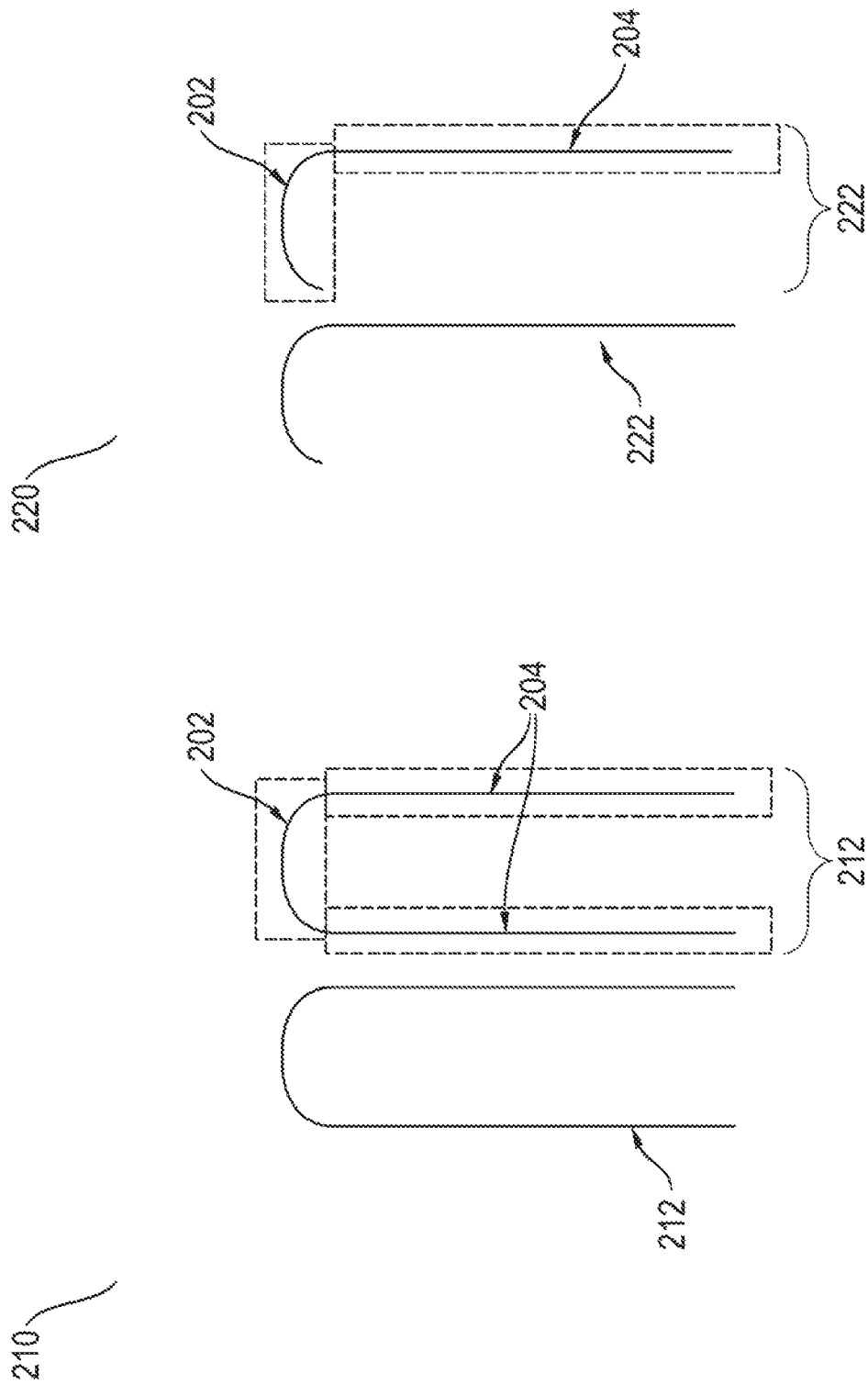

FIG. 2 shows schematic illustrations of side views 210 and, respectively, 220 of bent sheet-metal partial pieces 212 and, respectively, 222 which are formed in embodiments of the method according to aspects of the invention. According to aspects of the invention, the bent sheet-metal partial pieces 212 and, respectively, 222 have a curved portion 202, which is in thermal contact with the power electronics system, and at least one limb 204 which, if a plurality of bent sheet-metal partial pieces 212 and, respectively, 222 are lined up with one another and have similarities to a comb as viewed from the side, represents one respective comb tooth and is in thermal contact with the respective energy storage element. View 210 shows two "U"-shaped bent sheet-metal partial pieces 212 with a curved portion 202 and in each case two limbs 204. An energy storage element is received between the two limbs 204. View 220 shows two "J"-shaped bent sheet-metal 2 partial pieces 222 with a curved portion 202 and in each case one limb 204 which makes thermal contact with the respective energy storage element from one side.

Figure 3:
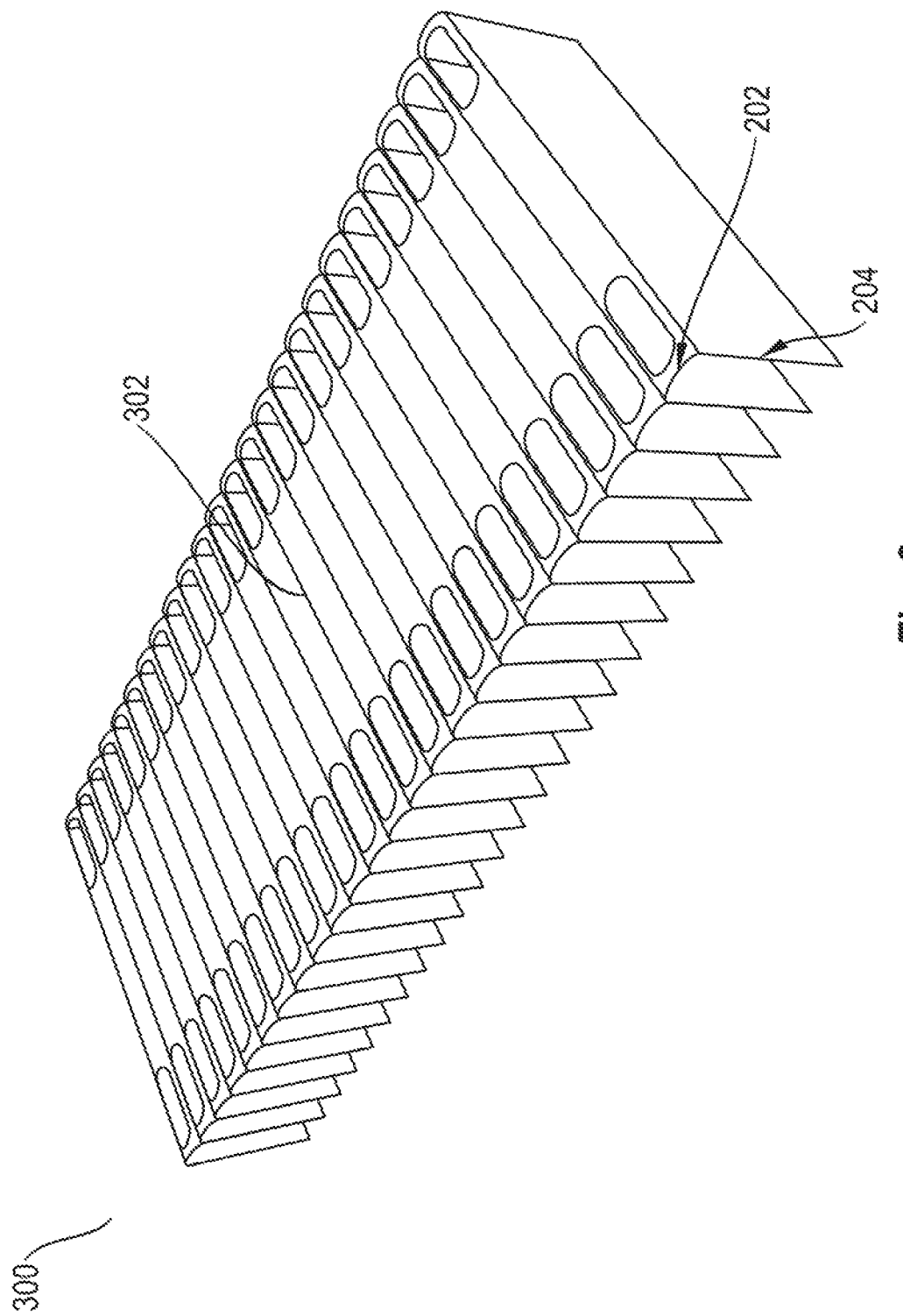

FIG. 3 shows a perspective illustration 300 of a thermally conductive element 302 which is formed in one embodiment of the method according to aspects of the invention and has a large number of curved portions 202 and limbs 204. A respective curved portion part contains two ovally rounded cutouts which, after a respective energy storage element is received, allow access to the connections of said energy storage element from above. The thermally conductive element 302 can either be presented composed of a single piece of sheet metal in a comb-like manner or made up of a plurality of bent sheet-metal partial pieces which constitute a sub-quantity of the single piece of sheet metal. In this case, the thermally conductive element 302 can be made up of the "U"- or "J"-shaped bent sheet-metal partial pieces shown in FIG. 2.

Figure 4:
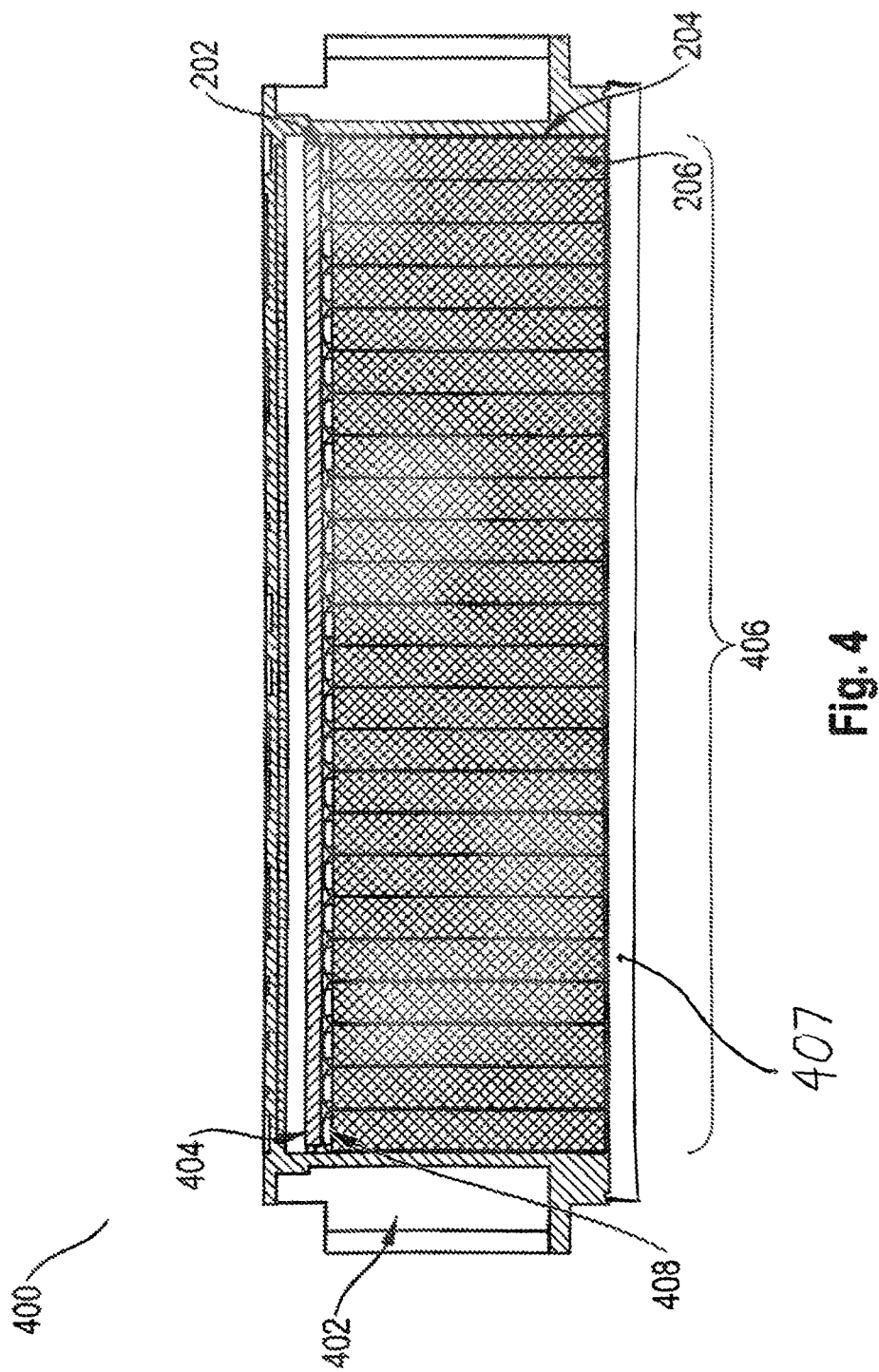

FIG. 4 shows a schematic illustration 400 of a side view of a section through a battery module 402 which is obtained with one embodiment of the method according to aspects of the invention. The battery module 402 is seated, by way of its lower side, on a cooling plate (e.g., a plate that absorbs waste heat and dissipates the waste heat by way of channels formed in the plate through which a cooling fluid travels) of a cooling system 407 (shown schematically in FIG. 4 only). The battery housing contains a combination 406 of energy storage units and thermally conductive element, wherein a comb tooth or limb 204 and a curved portion 202 of the thermally conductive element are respectively provided for the energy storage unit 206. An opening which is respectively provided in the region of the curved portion 202 or a corresponding cutout (not shown in the illustration 400 but discussed in relation to FIG. 3) receives a respective upper connection 408 of the respective energy storage unit 206. The power electronics system 404, from which heat is discharged by means of the combination 406, is situated on top of the curved portions 202 of the thermally conductive element. According to aspects of the invention, said discharge of heat takes place by means of the curved portions 202 of the thermally conductive element which are firstly in contact with the power electronics system 404 and secondly dissipate the heat from there to the limbs 204 and finally to the energy storage units. In addition, the heat can also be directly discharged to a base of the battery housing by means of the thermally conductive element when, as in the embodiment shown, the limbs 204 are drawn downward in the direction of the cooling plate over an entire cell length and make thermal contact with said cooling plate. It is also conceivable for the areal extent of the limbs at the side to reach as far as a side wall of the battery housing and for heat to be discharged there. However, in general, provision is made according to aspects of the invention for curved portions 202 to be formed at those points at which the power electronics system 404 makes contact with the thermally conductive element, and for the thermally conductive element to form a combination 406 with the individual energy storage units 206.

Figure 5:
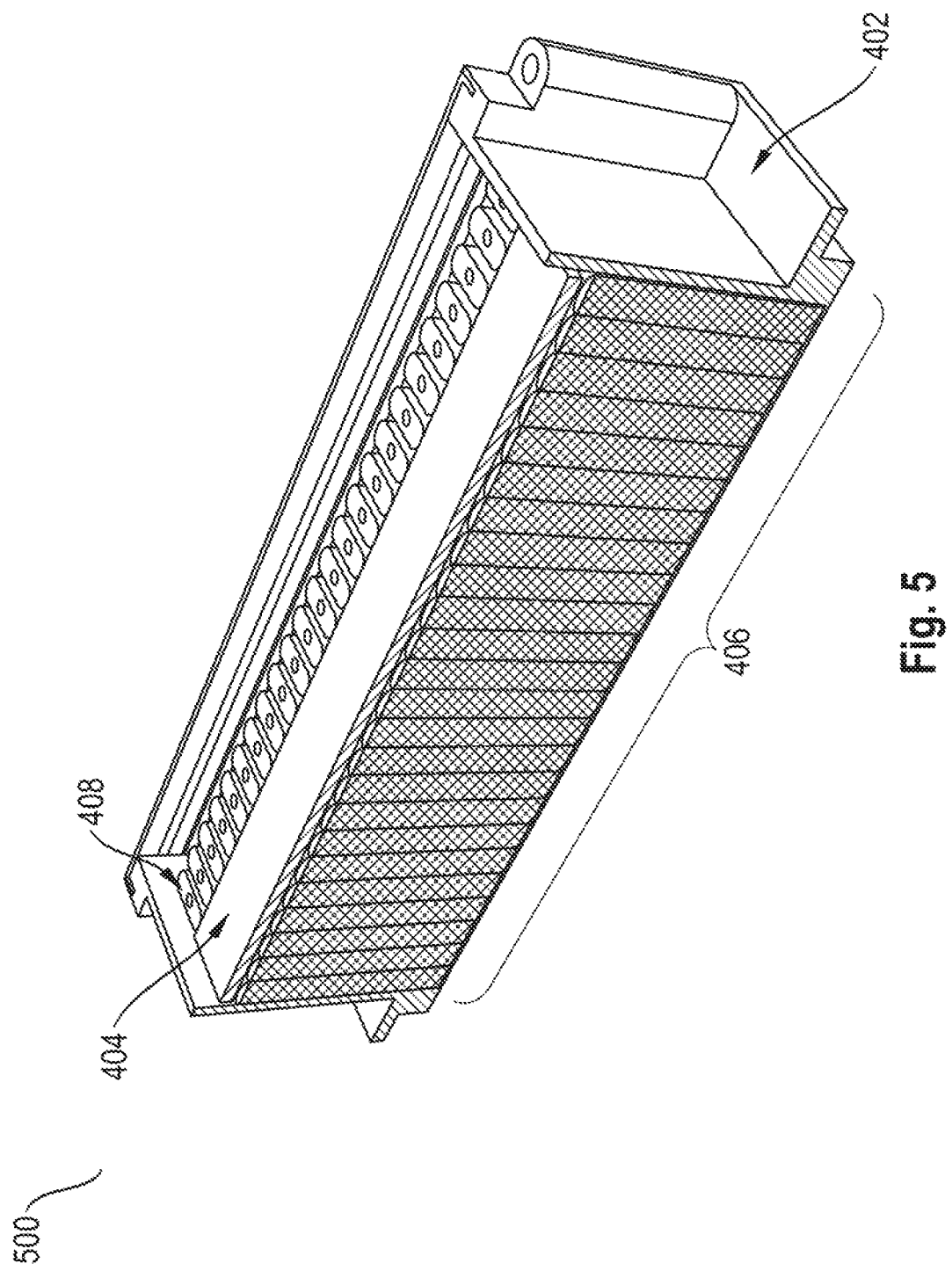

FIG. 5 shows a perspective illustration 500 of the section through the battery module 402 which is shown in FIG. 4 and obtained with one embodiment of the method according to aspects of the invention. Said figure shows, in particular on the combination 406 of energy storage units and thermally conductive element, the respective connections 408 of the energy storage units, which connections can be contacted from above in a respective opening of the thermally conductive element, and the power electronics system 404 situated on said connections.

Figure 6:
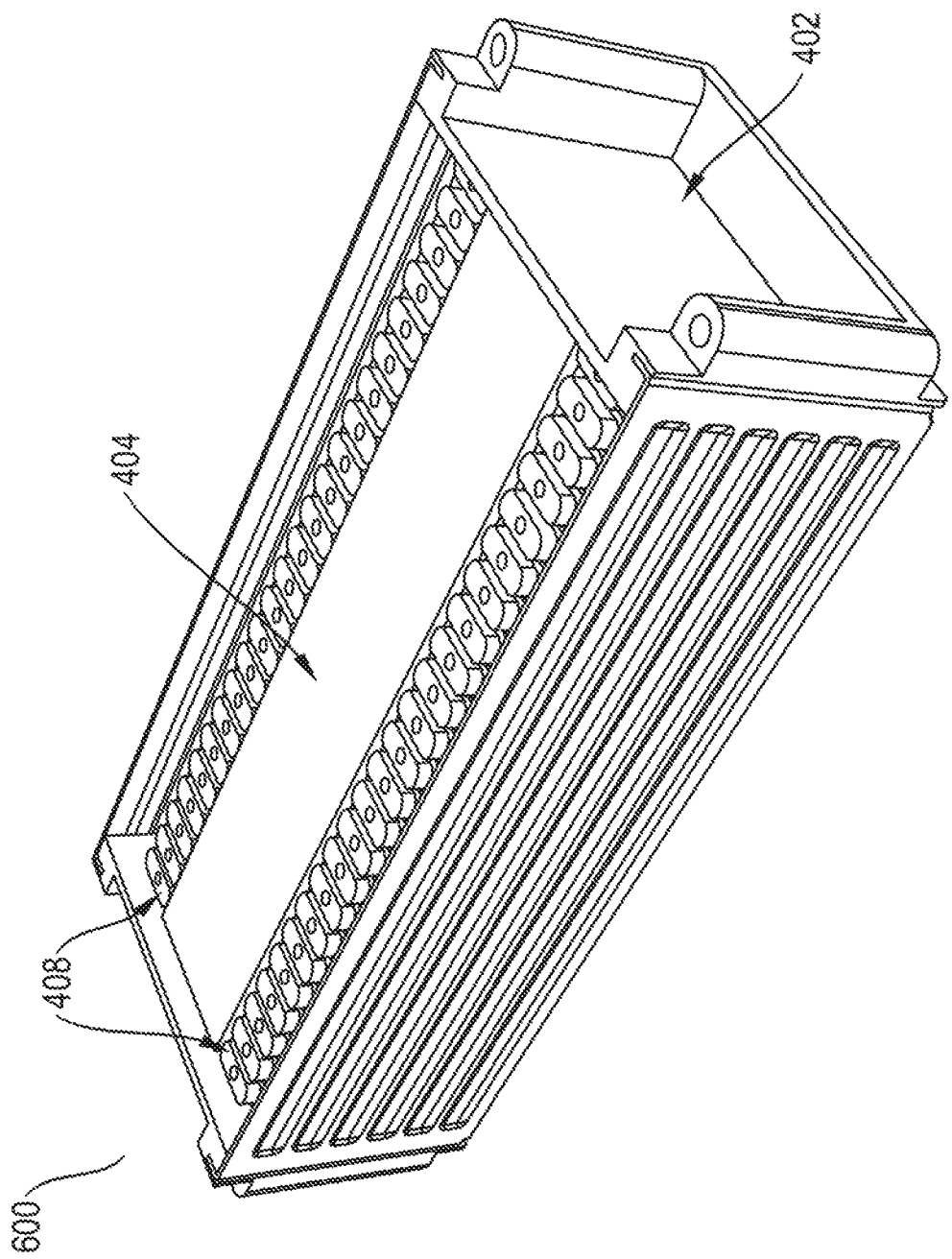

FIG. 6 shows a perspective illustration 600 of a battery module 402 which is obtained with one embodiment of the method according to aspects of the invention, without a housing cover. Said figure shows, in particular, the respective connections 408 of the energy storage units, which connections can be contacted from above in a respective opening of the thermally conductive element, and the power electronics system 404 situated on said connections.

Figure 7:
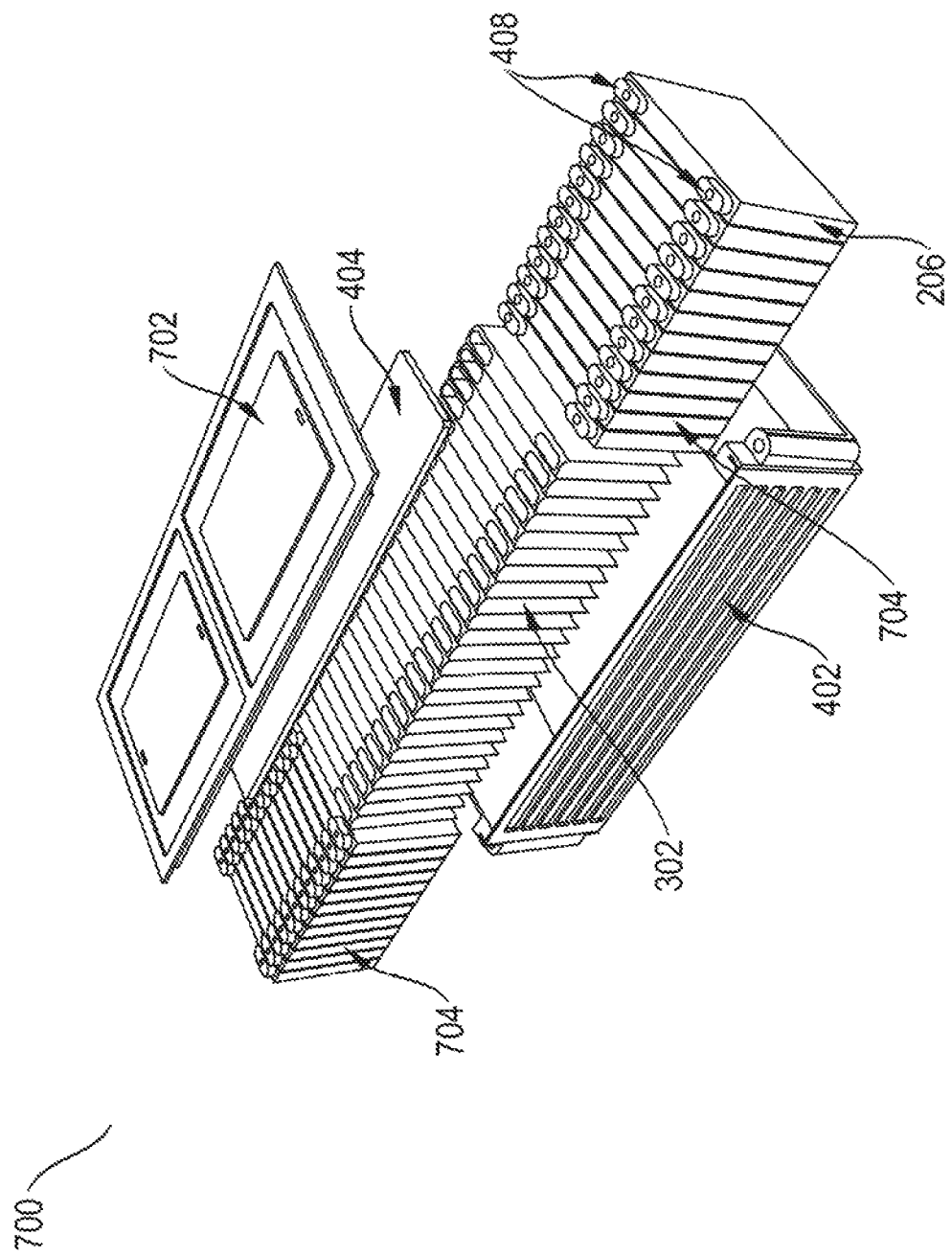

FIG. 7 shows an exploded illustration 700 of a battery module 402 which is obtained with one embodiment of the method according to aspects of the invention, with a horizontally arranged power electronics system 404. In the exploded illustration 700, the energy storage elements 704 have been illustrated in two halves to the sides of the thermally conductive element 302. In the assembled state, the energy storage elements 704 are seated within the battery module 402 with the thermally conductive element 302 inserted. Said figure dearly shows the connections 408 of the energy storage units 704. The power electronics system 404 is situated horizontally on top of the thermally conductive element 302 and is pressed onto the curved portions of the thermally conductive element 302 by the housing cover 702. Cooling is preferably performed by means of the base of the battery module 402. It is conceivable to also carry out the cooling by means of a housing side of the battery module 402, or to implement cooling from there in addition to the cooling at the base.

Figure 8:
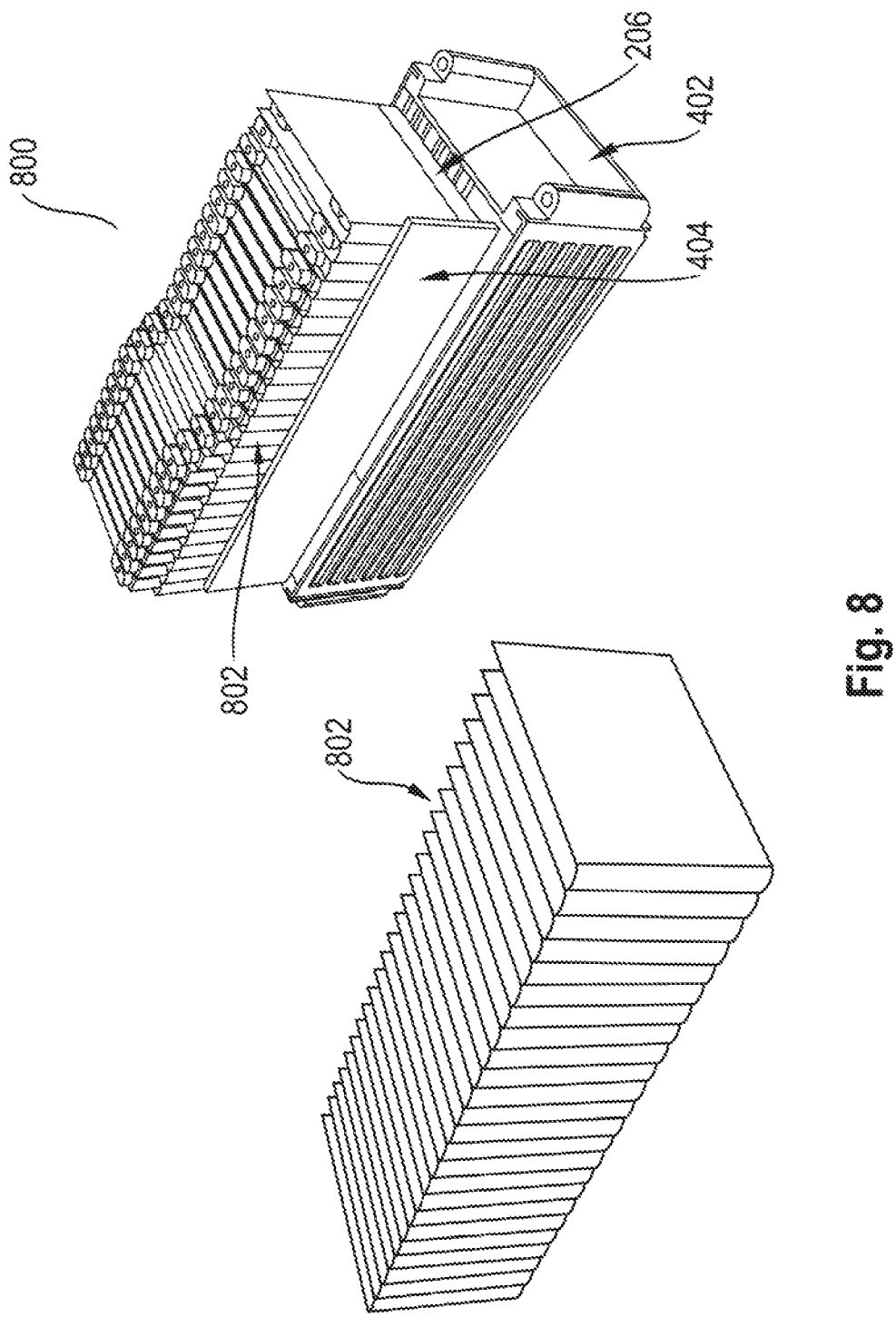

FIG. 8 shows an exploded illustration 800 of a battery module 402 which is obtained with one embodiment of the method according to aspects of the invention, with a laterally arranged power electronics system 404. Accordingly, the thermally conductive element 802 has curved portions according to aspects of the invention on that side which faces the power electronics system 404. An embodiment of this kind of the method according to aspects of the invention advantageously minimizes a number of openings otherwise required in the thermally conductive element 802 for connection points of the respective energy storage unit 206. In addition, the illustration 800 shows that the thermally conductive element 802 does not comprise the entire length of the respective energy storage unit 206, but rather leaves a small piece free at the bottom, that is to say is not in thermal contact with the base of the battery module 402.

Figure 9:
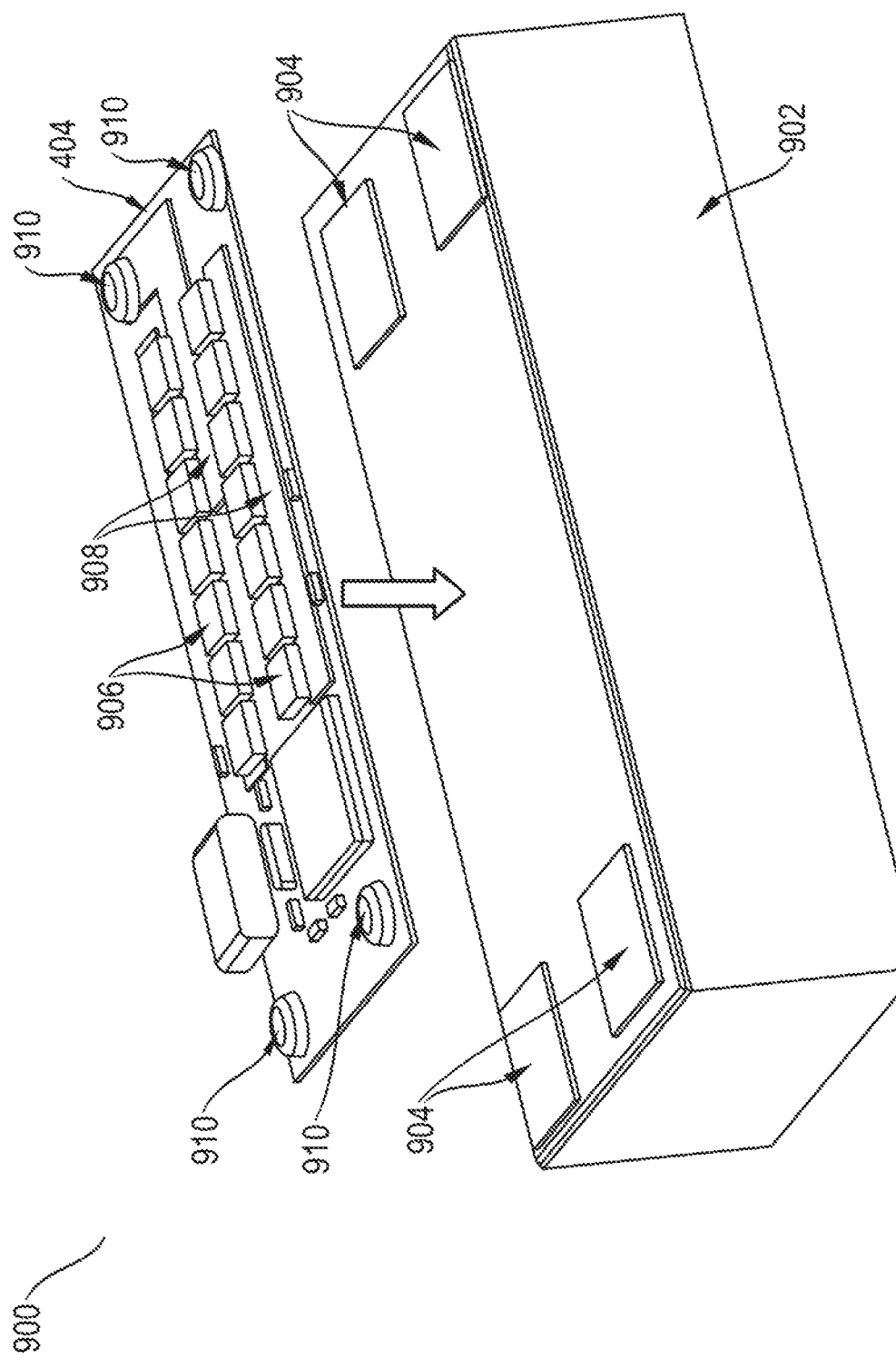

FIG. 9 shows a perspective illustration 900 of a connection of the power electronics system 404 for one embodiment of the method according to aspects of the invention. In the embodiment shown, the power electronics system 404, by means of metal contacts 910, makes contact with likewise metal contacts 904 of a sub-structure 902 illustrated in the shape of a box in a stylized manner here. For example, the substructure 902 comprises the energy storage units and the thermally conductive element, and also an interconnection of all of the energy storage units to the metal contacts 904. The illustration 900 shows a plurality of electronic components of different thicknesses which, in the same way, can additionally be located on a bottom side, not shown here, of the power electronics system 404. In particular, power semiconductor switches 906 and busbars 908, which carry currents lying in the region of a battery current and are formed for example from copper which is coated on the surface, form heat sources. They can both be contacted, at their surface, by the thermally conductive element. The busbars 908, owing to thick copper layers, may have the same overall height as the power semiconductor switches 906 or even protrude beyond them. Various electronic components, such as modern low-voltage power transistors for example, are also designed in such a way that heat can be drawn from them, by means of electrical contacts, into the copper of the busbars. In these cases, the heat can be discharged from the copper on the printed circuit board of the power electronics system 404, by means of the thermally conductive element, into the energy storage units.

Figure 10:
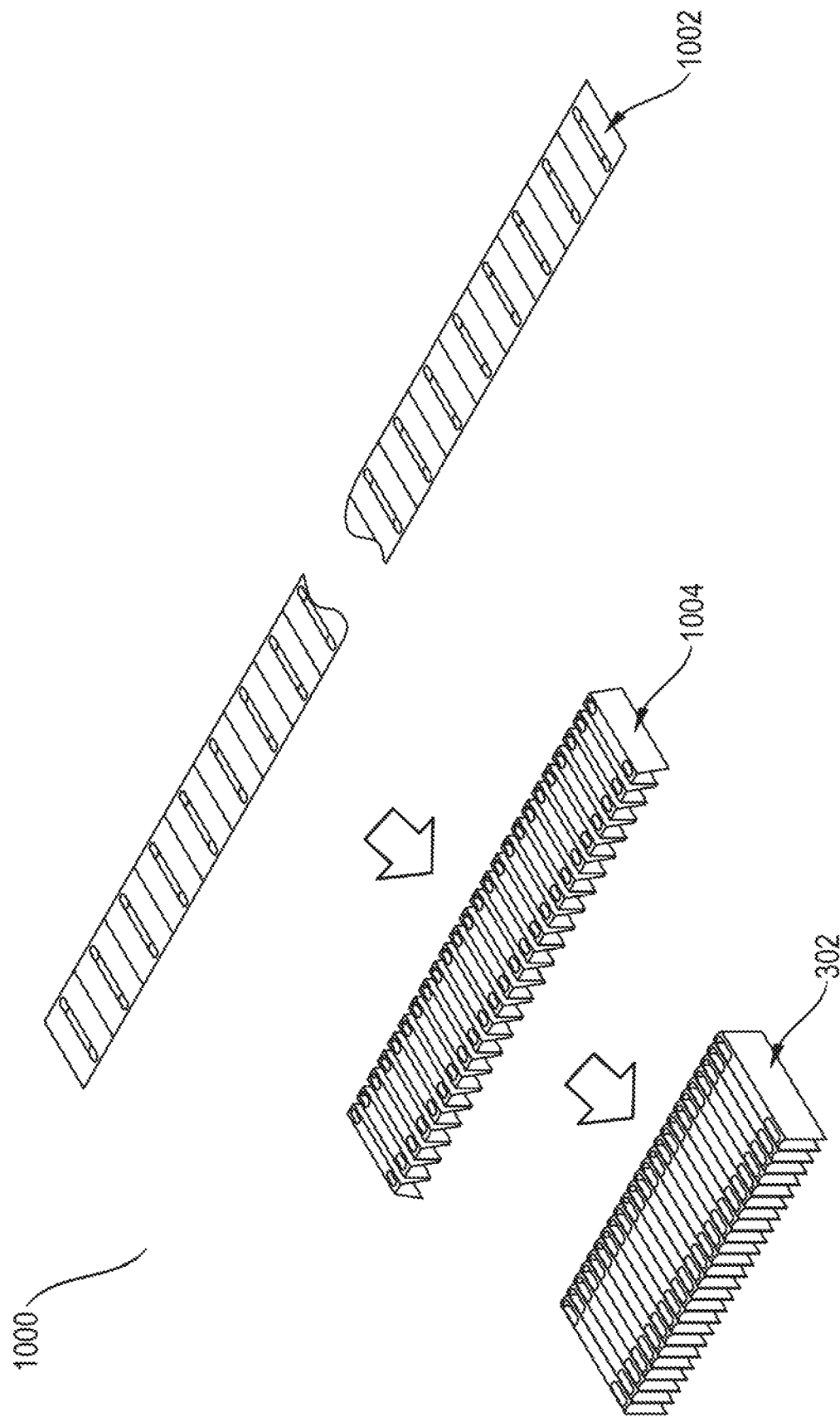

FIG. 10 shows a schematic illustration 1000 of a plurality of constructions 1002, 1004 during production of a thermally conductive element 302 which is formed for executing the method according to aspects of the invention. The production of a thermally conductive element 302 as a single sheet-metal piece or from a plurality of bent sheet-metal partial pieces can be performed, for example in a very cost-effective manner, in a stamping and bending process. In this stamping and bending process, a metal sheet 1002, preferably composed of a material exhibiting good thermal conductivity, such as aluminum or copper, is formed such that a surface is produced on which the power electronics system can be thermally contacted, that is to say the curved portions can be integrally formed, and the limbs which extend between the cells can be formed. The extensions in the construction 1004 are produced, for example, by so-called "v-bending". Any limbs on outer edges can be produced by so-called "edge bending". All cutouts required, in order for example to guide screw or weld connections of the energy storage units through the thermally conductive element to the power electronics system or to cut electronic components with a relatively large overall height on the power electronics circuit board out of the thermally conductive element, can be formed by stamping.

Figure 11:
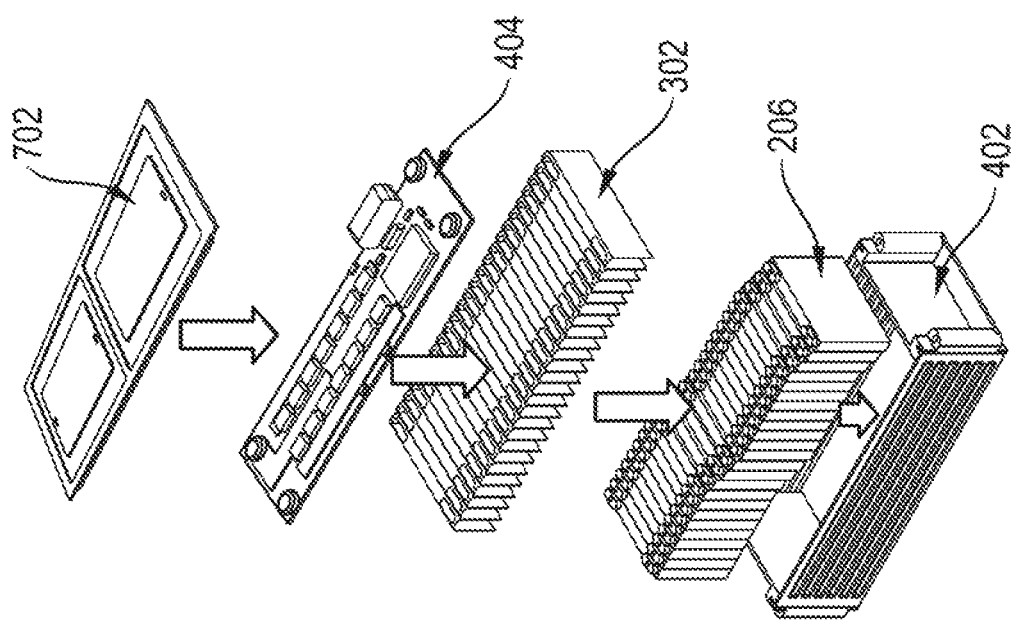

FIG. 11 shows an exploded illustration 1100 of a battery module 402 which is obtained with one embodiment of the method according to aspects of the invention. The respective energy storage units 206 are inserted into the battery housing of the battery module 402, the thermally conductive element 302 is then plug-mounted, and finally the power electronics system 404 is thermally contact-connected on the curved portions of the thermally conductive element 302 by well-defined contact-pressing of the housing cover 702.

What is claimed is:

1. A method for arranging a power electronics system which is integrated in a battery module, said method comprising:
   providing the battery module having a battery housing containing a plurality of energy storage units, the power electronics system, which is positioned adjacent the energy storage units and includes a printed circuit board populated with power semiconductor switches, and a thermally conductive element that creates thermal contact between the respective energy storage units and the power electronics system;
   coupling at least one side of the battery housing to a cooling system; and
   creating thermal contact between the respective energy storage units and the power electronics system using the thermally conductive element by (i) directly connecting a surface area of the thermally conductive element to a respective energy storage unit, and (ii) directly contacting a respective curved portion that is integrally formed on the thermally conductive element with a part of the power electronics system that is adjacent to the respective energy storage element, wherein the curved portion of the thermally conductive element is spring loaded against the power electronics system for cooling the power electronics system,
   wherein the thermally conductive element configured to directly transfer thermal energy from the power electronics system to the energy storage units.

2. The method as claimed in claim 1, wherein the thermally conductive element is composed of a single piece of sheet metal in a comb-like manner and the respective energy storage elements are received between respective comb teeth or limbs.

3. The method as claimed in claim 1, in which the thermally conductive element is composed of a plurality of bent sheet-metal partial pieces.

4. The method as claimed in claim 3, in which a respective bent sheet-metal partial piece is associated with each energy storage unit.

5. The method as claimed in claim 4, in which the respective bent sheetmetal partial piece has a "U"-shape and a respective energy storage unit is received between two limbs of the "U" and the curved portion is embodied by a bend of the "U".

6. The method as claimed in claim 4, in which the respective bent sheetmetal partial piece has a "J"-shape and a respective energy storage unit is contacted by a limb of the "J" and the curved portion is embodied by a bend of the "J".

7. The method as claimed in claim 1, in which the respective energy storage unit is a battery cell which takes the form of either a prismatic cell, a pouch cell, or a plurality of round cells arranged in series.

8. The method as claimed in claim 1, in which a spring force conferred by the curved portion is at least partially established by pressing the housing cover onto the power electronics system.

9. The method as claimed in claim 1, in which a spring force conferred by the curved portion is at least partially established by fixing the power electronics system inside of the battery housing.

10. The method as claimed in claim 1, wherein limbs of the thermally conductive element extending from the respective curved portion are positioned to contact a cooling plate of the cooling system.

11. The method as claimed in claim 1, further comprising a plurality of the thermally conductive elements, wherein the thermally conductive elements are separate, and each thermally conductive element is associated with a single respective energy storage unit.

12. The method as claimed in claim 1, further comprising a cutout formed on the respective curved portion on the thermally conductive element that is configured to accommodate a connector of a respective energy storage unit.

13. The method as claimed in claim 1, wherein the thermally conductive element further comprises limbs extending from the respective curved portion, and free ends of the limbs are spaced apart.

* * * * *